United States Patent
Kumar et al.

(10) Patent No.: US 8,904,263 B1
(45) Date of Patent: Dec. 2, 2014

(54) ERROR CORRECTION CAPABILITY IMPROVEMENT IN THE PRESENCE OF HARD BIT ERRORS

(71) Applicant: SK hynix memory solutions inc., San Jose, CA (US)

(72) Inventors: Naveen Kumar, San Jose, CA (US); Zheng Wu, San Jose, CA (US); Jason Bellorado, San Jose, CA (US); Lingqi Zeng, Turlock, CA (US); Marcus Marrow, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 83 days.

(21) Appl. No.: 13/770,902

(22) Filed: Feb. 19, 2013

Related U.S. Application Data

(60) Provisional application No. 61/615,165, filed on Mar. 23, 2012.

(51) Int. Cl.
*H03M 13/00* (2006.01)
*H03M 13/29* (2006.01)

(52) U.S. Cl.
CPC .................. *H03M 13/2906* (2013.01)
USPC ........................... 714/780; 714/774

(58) Field of Classification Search
CPC .............. H03M 13/1125; H03M 13/3927
USPC ..................................... 714/774, 780
See application file for complete search history.

(56) References Cited

U.S. PATENT DOCUMENTS

| | | | |
|---|---|---|---|
| 8,149,959 B1 * | 4/2012 | Varnica et al. | 375/340 |
| 8,743,500 B2 * | 6/2014 | Blinick et al. | 360/65 |
| 2005/0111592 A1 * | 5/2005 | Yee | 375/341 |
| 2010/0088575 A1 * | 4/2010 | Sharon et al. | 714/763 |
| 2011/0264979 A1 * | 10/2011 | Gunnam et al. | 714/752 |

\* cited by examiner

*Primary Examiner* — M. Mujtaba K Chaudry
(74) *Attorney, Agent, or Firm* — Van Pelt, Yi & James LLP

(57) ABSTRACT

A first set of one or more soft detector outputs is generated. It is determined if error correction decoding is successful using the first set of soft detector outputs. In the event it is determined error correction decoding is not successful, a second set of one or more soft detector outputs is generated where a largest likelihood associated with the first set is greater than a largest likelihood associated with the second set.

10 Claims, 5 Drawing Sheets

ERROR CORRECTION CAPABILITY IMPROVEMENT IN THE PRESENCE OF HARD BIT ERRORS

CROSS REFERENCE TO OTHER APPLICATIONS

This application claims priority to U.S. Provisional Patent Application No. 61/615,165 entitled ERROR CORRECTION CAPABILITY IMPROVEMENT IN PRESENCE OF HARD BIT ERRORS filed Mar. 23, 2012 which is incorporated herein by reference for all purposes.

BACKGROUND OF THE INVENTION

FIG. 1 is a diagram showing an example of a hard bit error. In the example shown, diagram 100 shows two tracks before a write. In the state shown, track N (110a) is blank and track N+1 (112a) includes the bit sequence [0 0 1 0 0 0]. Track N is then written and diagram 150 shows the state of the two tracks after the write. After the write, track N (110b) includes the bit sequence [0 0 0 0 0 0]. Although track N+1 was not intended to be written to, bit 114b in track N+1 (112b) flipped from a 1 (see, e.g., 114a) to a 0 (see, e.g., 114b). This is an example of a hard bit error. Correcting hard bit errors is very difficult for a soft decision error correction decoder. Although track N+1 was not intended to be written, a 0 was effectively written to bit 114b and so bit 114b is indistinguishable to an error correction decoder from a genuine and/or intended 0. As tracks get closer to each other and/or as the width of each track gets thinner, hard bit errors are becoming more common. New techniques which improve error correction performance in the presence of hard bit errors would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 2:
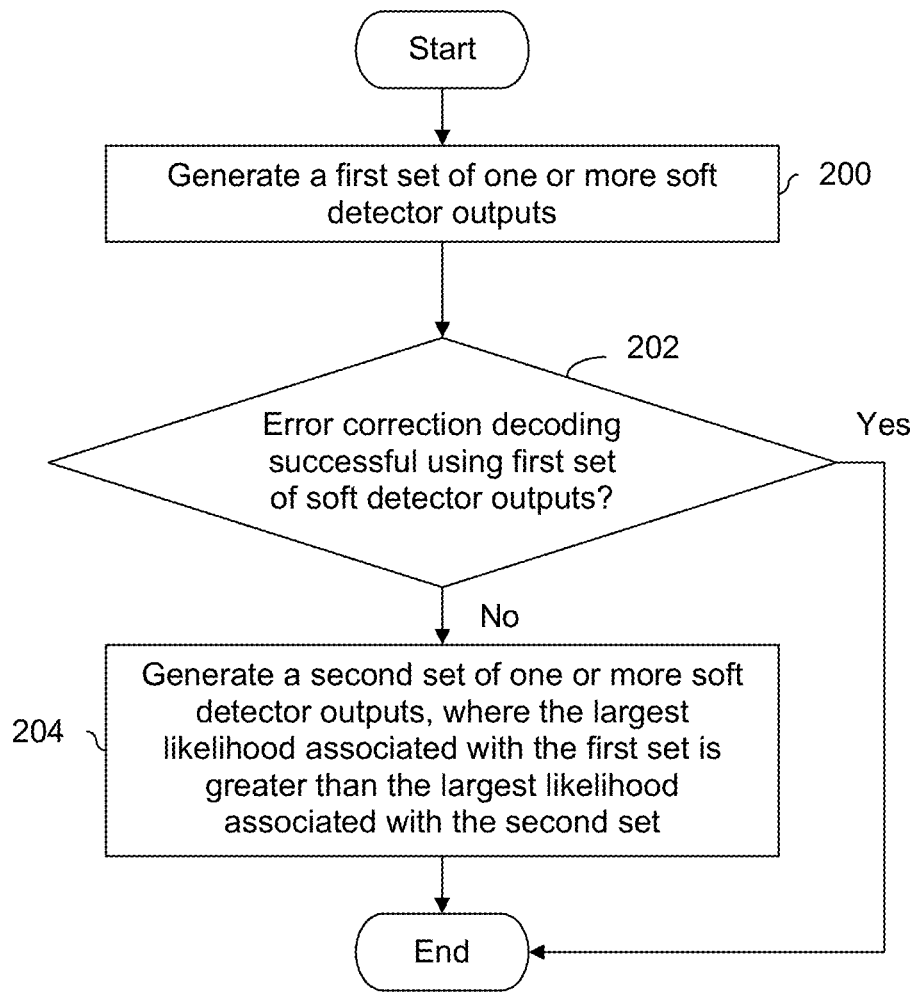
FIG. 2 is a flowchart illustrating a process for generating soft detector outputs which improve performance in the presence of hard bit errors.

FIG. 2 is a flowchart illustrating a process for generating soft detector outputs which improve performance in the presence of hard bit errors. At 200, a first set of one or more soft detector outputs are generated. As used herein, soft information includes or has associated with it a likelihood (also referred to as a certainty or a probability) and so soft detector outputs are outputs generated by a detector which include likelihoods. For example, log-likelihood ratio (LLR) values may be generated at 200. The sign of an LLR value corresponds to a decision (e.g., a positive sign corresponds to a 0 and a negative sign corresponds to a 1) and the magnitude of the LLR value corresponds to the likelihood. In contrast, hard information has no associated likelihood (e.g., a 0 or a 1 without an associated likelihood).

It is determined at 202 if error correction decoding successful using the first set of soft detector outputs. For example, the first set of soft detector outputs generated at 200 may be passed to a low-density parity check (LDPC) decoder and the decision at 202 may depend upon whether the LDPC decoder is able to successfully decode the received first set of soft detector outputs. If error correction decoding is determined to be successful at 202, the process ends.

If not, at 204, a second set of one or more soft detector outputs is generated. In this scenario, correcting more hard bit errors is the target. The second set of detector can provide better performance in correcting hard bit errors, while not as good as the first set of detector in correcting normal errors. The output LLR can be scaled down properly, so that the input LLR for hard bit errors will have lower likelihoods.

Figure 1:
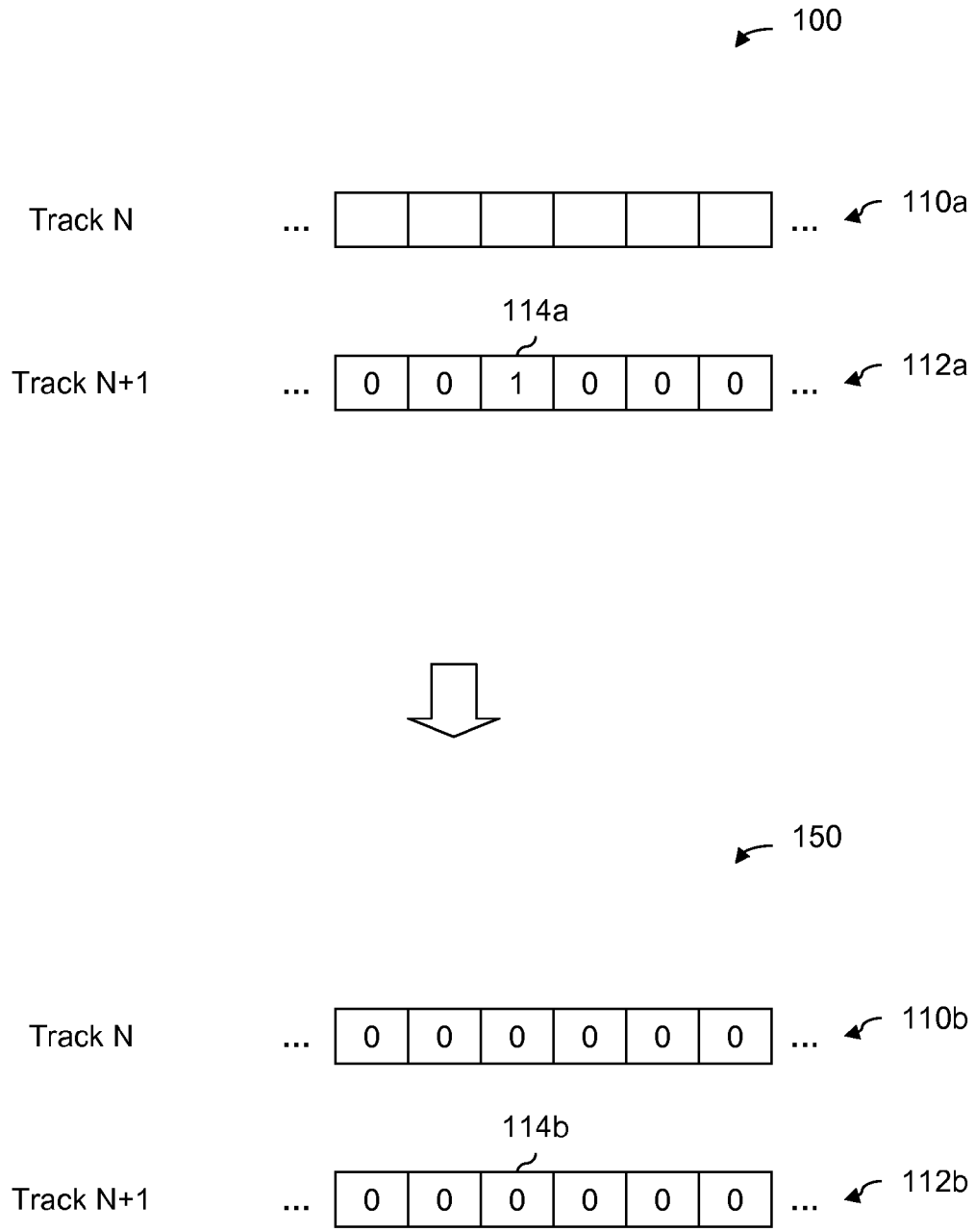
FIG. 1 is a diagram showing an example of a hard bit error.

In one example, suppose steps 200 and 204 are performed by one or more soft output Viterbi detectors and LRR values are generated at 200 and 204. If 5-bit LLR values are used (e.g., 1 bit to represent the sign and 4 bits for the magnitude), then LLR values generated at 200 range from −15 to 15 and the LLR values generated at 204 (in this example at least) range from −13 to 13. Since the magnitude of an LLR value corresponds to likelihood, the LLR values after scaling have a smaller likelihood. (i.e., 15) This may enable a downstream error correction decoder (e.g., an LDPC decoder) during the second decoding attempt or iteration to flip any hard bit errors (e.g., hard bit error 114b in FIG. 1).

In various embodiments, the process of FIG. 2 is performed by a variety of systems having a variety of configurations. The following figures describe two such exemplary systems.

Figure 3:
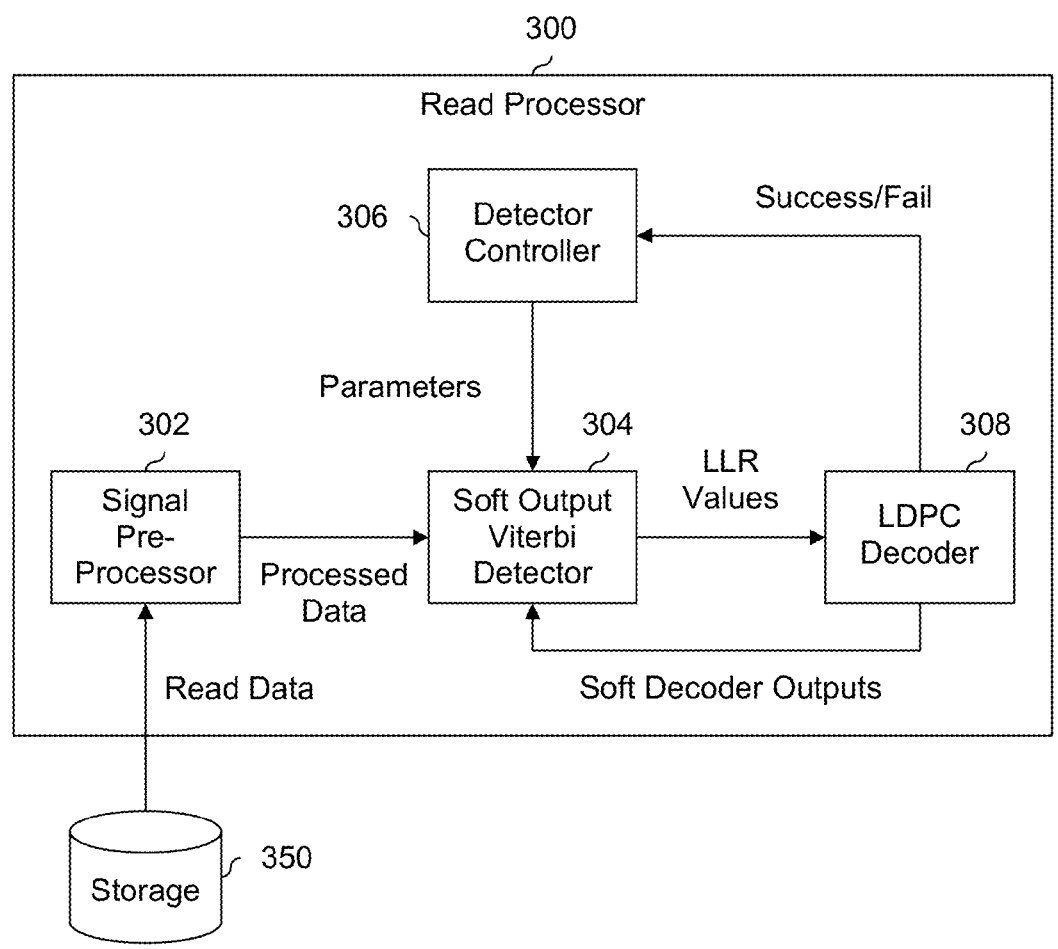
FIG. 3 is a diagram showing an embodiment of a read processor with a configurable soft output Viterbi detector.

FIG. 3 is a diagram showing an embodiment of a read processor with a configurable soft output Viterbi detector. In the example shown, read processor 300 accesses and processes information stored in storage 350. For clarity, a corresponding write processor (e.g., which processes information for storage and/or writes information to storage 350) is not shown in this figure. However, this is not intended to be limiting and systems which perform the techniques described herein may include a write processor or any other component not shown herein. In some embodiments, read processor 300 is implemented on or includes a semiconductor, such as an application-specific integrated circuit (ASIC) or a field-programmable gate array (FPGA).

Read data is passed from storage 350 to signal pre-processor 302. In some embodiments, storage 350 includes magnetic storage (e.g., a hard disk drive). In some embodiments, data read from storage 350 includes hard bit errors. In various embodiments, pre-processor 302 performs a variety of processes on the read data including (but not limited to) analog to digital conversion, signal acquisition (e.g., frequency and/or phase adjustment of a sampling clock), equalization, and/or buffering.

The processed data is passed from signal pre-processor 302 to soft output Viterbi detector 304. In this example, detector 304 is a configurable detector where the parameters are configurable. Detector controller 306 is responsible for programming detector 304 with the appropriate parameters at the appropriate time. In this example, when data is being processed for the first time, detector controller 306 configures detector 304 with parameters that minimize the bit error rate of the detector output, which is optimized over normal cases. With this configuration (i.e., a maximum LLR magnitude of 15), the LLR values generated take integer values from −15 to 15.

The LLR values are passed from detector 304 to LDPC decoder 308 which performs error correction decoding on the LLR values. The results of the decoding (e.g., success or failure) are passed to detector controller 308. If decoding is unsuccessful, then detector controller 306 configures detector 304 with a different set of parameters, which works better for the purpose of correcting hard bit errors. For example, the parameters can be set to the expansion of a least square target. The output LLRs are then scaled down before going into the LDPC decoder. For example, after scaling, the maximum LLR magnitude may be reduced from 15 to 13. The distribution of the LLRs from detector 304 in this setting is different from that of the LLRs from detector output with previous normal settings. The distribution is more spread out with less extreme values (−15 or 15). At this second iteration by detector 304, soft decoder outputs from LDPC decoder 308 may be used in generating the second set of LLR values. The LLR values are then passed to LDPC decoder 308 for a second decoding attempt. Configuring detector 304 and scaling factor beta to produce lower magnitude LLR values for a second iteration or attempt may enable LDPC decoder 308 to correct hard bit errors in the data.

Figure 4:
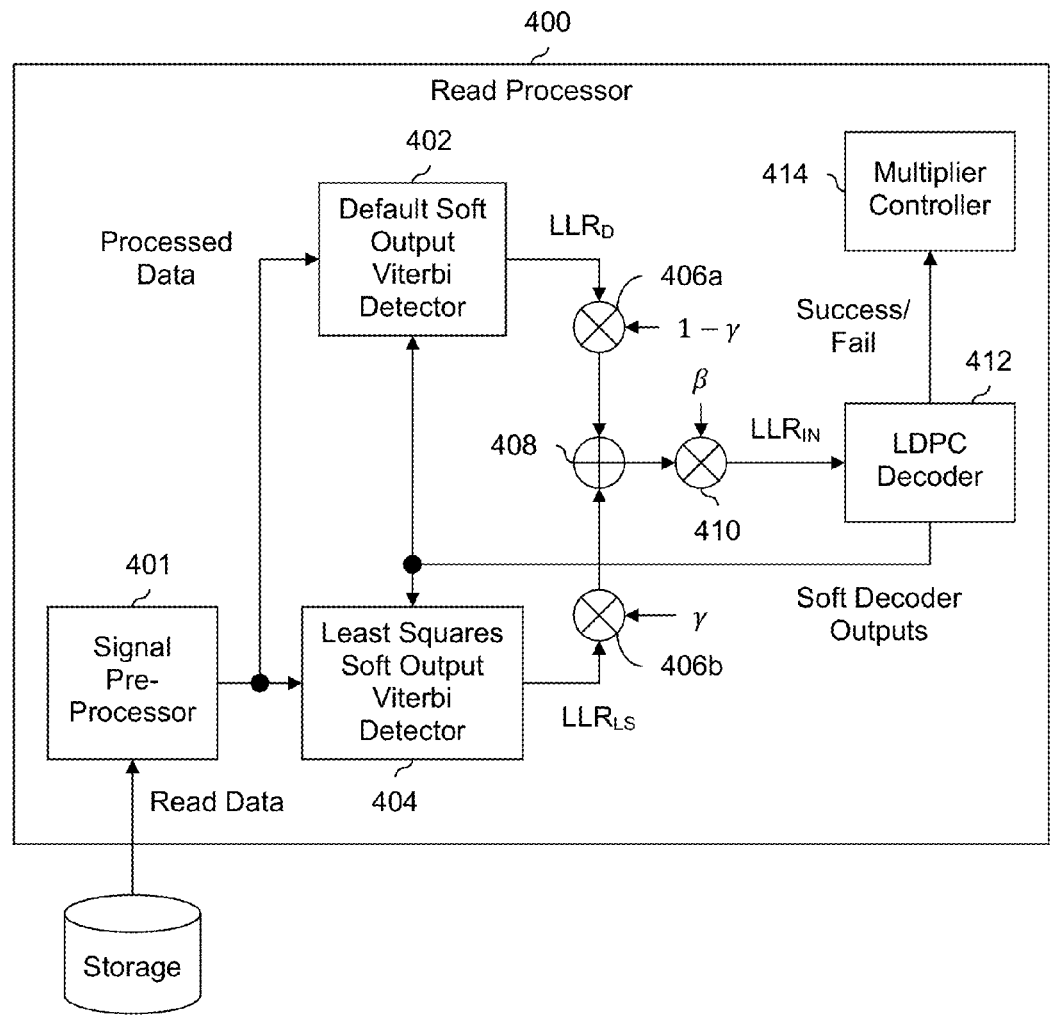
FIG. 4 is a diagram showing an embodiment of a read processor with tunable contributions from two soft output Viterbi detectors.

FIG. 4 is a diagram showing an embodiment of a read processor with tunable contributions from two soft output Viterbi detectors. In the example shown, processed data from signal pre-processor 401 is passed to default soft output Viterbi detector 402 and least squares soft output Viterbi detector 404. In this example, the output of both detectors are combined together to provide a better cover over normal errors and hard bit errors. In some embodiments, a least squares soft output Viterbi detector is a normal or regular detector and default detector 402 is optimized or modified to generate LLR values with larger magnitudes compared to least squares detector 404. In some embodiments, a detector with optimized parameters is a detector used in normal cases (e.g., on a first attempt or to a greater degree during a first attempt) and a least squares detector is used to help hard bit error correction (e.g., on a second attempt or to a greater degree during a second attempt).

The LLR values generated by default detector 402 ($LLR_D$) are passed to a first multiplier 406a and the LLR values generated by least squares detector 404 ($LLR_{LS}$) are passed to a second multiplier 406b. Multiplier 406a multiplies $LLR_D$ by $1-\gamma$ and multiplier 406b multiplies $LLR_{LS}$ by $\gamma$. The products from multipliers 406a and 406b are passed to adder 408 where they are summed. $\gamma$ ranges in value from 0 to 1, inclusive, so (for example) if $\gamma=0$ then all of the sum output by adder 408 comes from $LLR_D$ and if $\gamma=1$ then all of the sum output by adder 408 comes from $LLR_{LS}$.

The sum output by adder 408 is then multiplied by $\beta$ by multiplier 410. This produces $LLR_{IN}=\beta \times(((1-\gamma) \times LLR_D)+(\gamma \times LLR_{LS}))$ which is input to LDPC decoder 412. $\beta$ is a scaling factor.

When there are few hard bit errors, LDPC decoder 412 may have better error correction performance with $LLR_D$ than with $LLR_{LS}$ and so for a first decoding attempt, $\gamma$ is set to 0 (i.e., $\gamma_1=0$) and $\beta$ is set to 1 (i.e., $\beta_1=1$). If, after a first decoding attempt, LDPC decoder 412 signals to multiplier controller 414 that decoding is unsuccessful, multiplier controller 414 sets $\gamma$ to second value (i.e., $\gamma_2$) in the range (0,1] so that at least some of the $LLR_{IN}$ comes from $LLR_{LS}$ during a second decoding attempt. LDPC decoder 412 does better with $LLR_{LS}$ than with $LLR_D$ when there are hard bit errors, so using $LLR_{IN}$ comes from $LLR_{LS}$ during a second or later decoding attempt may be desirable. Depending on the frequency of occurrence of the hard bit errors, $\gamma_2$ can be set to different values in (0,1]. For example, in a scenario of few hard bit error occurring, a small value of $\gamma_2$ in the range (0,0.5) may be desirable. If decoding again fails during a second attempt, then $\gamma$ may be further increased in another attempt (e.g., $\gamma_1<\gamma_2<\gamma_3 \ldots$). During generation of the second set of LLR values, both default detector 402 and least squares detector 404 use soft decoder outputs from LDPC decoder 412. $\beta$ in the second or later decoding attempt may be set to an optimized value which is smaller than 1, which was used in the first decoding attempt. In other words, at least in this example, $\beta_1=1$ and $\beta_2<1$ and so $\beta_1>\beta_2$).

In various applications, FIG. 3 may be more attractive compared to FIG. 4 or vice versa. For example, if size and/or cost is a concern, FIG. 3 may be preferable over FIG. 4 since it includes a single detector, making it smaller and/or cheaper than FIG. 4 which includes two detectors. However, in some applications, FIG. 4 is more attractive than FIG. 3. For example, in some high throughput applications FIG. 4 may be desirable because going back to an original detector ties up the hardware, which does not allow new sectors to be processed. For FIG. 4, if the first decoding attempt is with $\gamma_1=0$, then only for the first attempt the bottom soft output Viterbi detector 404 would not be used. So it could be used to process sectors that have difficulty decoding while the top soft output Viterbi detector 402 is used to maintain the throughput for all other sectors.

Figure 5:
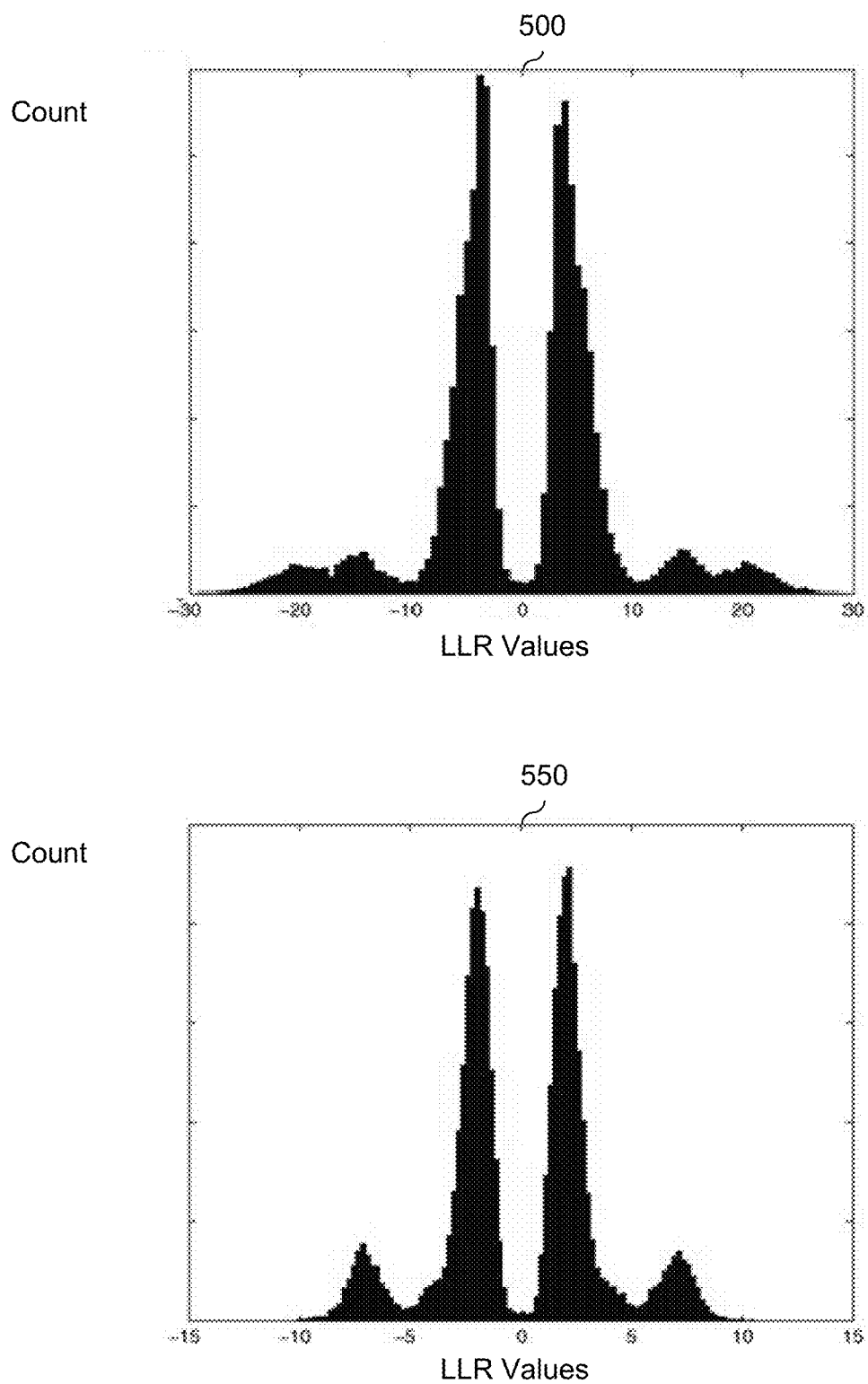
FIG. 5 is a diagram showing an embodiment of a first and second set of LLR values.

FIG. 5 is a diagram showing an embodiment of a first and second set of LLR values. In the example shown, histogram 500 includes a first set of LLR values and histogram 550 includes a second set of LLR values. While the magnitudes of LLR values (which correspond to likelihoods) go up to ~30 in histogram 500, they only go up to a ~12 in histogram 550. Going back to FIG. 2, the LLR values in histogram 500 may be generated at step 200 and the LLR values in histogram 550 may generated at step 204.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
generating a first set of one or more soft detector outputs, including by:
using at least a first detector to generate the first set of soft detector outputs;
multiplying the output of the first detector by $(1-\gamma_1)$ to produce a first product;
multiplying the output of a second detector by $\gamma_1$ to produce a second product,
wherein $\gamma_1$ is in the range of $[0,1]$ and the second detector includes a least squares soft output Viterbi detector; and
summing the first product and the second product; and
using an error correction decoder to determine if error correction decoding is successful using the first set of soft detector outputs; and
in the event it is determined error correction decoding is not successful, generating a second set of one or more soft detector outputs, including by:
using at least the first detector and the second detector to generate the second set of soft detector outputs;
multiplying the output of the first detector by $(1-\gamma_2)$ to produce a third product;
multiplying the output of the second detector by $\gamma_2$ to produce a fourth product,
wherein $\gamma_2$ is in the range of $[0,1]$ and $\gamma_1 < \gamma_2$; and
summing the third product and the fourth product, wherein:
the first set of one or more soft detector outputs includes one or more likelihoods;
the second set of one or more soft detector outputs includes one or more likelihoods; and
the largest likelihood associated with the first set of soft detector outputs is greater than the largest likelihood associated with the second set of soft detector outputs.

2. The method of claim 1, wherein the error correction decoder includes a low-density parity-check (LDPC) decoder.

3. The method of claim 1, wherein the first detector includes a soft output Viterbi detector.

4. The method of claim 1, wherein:
generating the first set further includes multiplying the sum of the first product and the second product by $\beta_1$; and
generating the second set further includes multiplying the sum of the third product and the fourth product by $\beta_2$, wherein $\beta_1 > \beta_2$.

5. A system, comprising:
an error correction decoder configured to determine if error correction decoding is successful using a first set of one or more soft detector outputs; and
one or more detectors configured to:
generate the first set of soft detector outputs, including by:
using at least a first detector to generate the first set of soft detector outputs;
multiplying the output of the first detector by $(1-\gamma_1)$ to produce a first product;
multiplying the output of a second detector by $\gamma_1$ to produce a second product, wherein $\gamma_1$ is in the range of $[0,1]$ and the second detector includes a least squares soft output Viterbi detector; and
summing the first product and the second product; and
in the event it is determined error correction decoding is not successful, generate a second set of one or more soft detector outputs, including by:
using at least the second detector to generate the second set of soft detector outputs;
multiplying the output of the first detector by $(1-\gamma_2)$ to produce a third product;
multiplying the output of the second detector by $\gamma_2$ to produce a fourth product, wherein $\gamma_2$ is in the range of $[0,1]$ and $\gamma_1 < \gamma_2$; and
summing the third product and the fourth product, wherein:
the first set of one or more soft detector outputs includes one or more likelihoods;
the second set of one or more soft detector outputs includes one or more likelihoods; and
the largest likelihood associated with the first set of soft detector outputs is greater than the largest likelihood associated with the second set of soft detector outputs.

6. The system of claim 5, wherein the error correction decoder includes a low-density parity-check (LDPC) decoder.

7. The system of claim 5, wherein the one or more detectors include a soft output Viterbi detector.

8. The system of claim 5, wherein:
generating the first set further includes multiplying the sum of the first product and the second product by $\beta_1$; and
generating the second set further includes multiplying the sum of the third product and the fourth product by $\beta_2$, wherein $\beta_1 > \beta_2$.

9. The system of claim 5, further comprising a semiconductor, including one or more of the following: an application-specific integrated circuit (ASIC) or a field-programmable gate array (FPGA).

10. A computer program product, the computer program product being embodied in a non-transitory computer readable storage medium and comprising computer instructions for:
generating a first set of one or more soft detector outputs, including by:
using at least a first detector to generate the first set of soft detector outputs;
multiplying the output of the first detector by $(1-\gamma_1)$ to produce a first product;
multiplying the output of a second detector by $\gamma_1$ to produce a second product,
wherein $\gamma_1$ is in the range of $[0,1]$ and the second detector includes a least squares soft output Viterbi detector; and
summing the first product and the second product;
determining if error correction decoding is successful using the first set of soft detector outputs; and
in the event it is determined error correction decoding is not successful, generating a second set of one or more soft detector outputs, including by:
using at least the second detector to generate the second set of soft detector outputs;
multiplying the output of the first detector by $(1-\gamma_2)$ to produce a third product;
multiplying the output of the second detector by $\gamma_2$ to produce a fourth product,
wherein $\gamma_2$ is in the range of $[0,1]$ and $\gamma_1 < \gamma_2$; and
summing the third product and the fourth product, wherein:
the first set of one or more soft detector outputs includes one or more likelihoods;

the second set of one or more soft detector outputs includes one or more likelihoods; and
the largest likelihood associated with the first set of soft detector outputs is greater than the largest likelihood associated with the second set of soft detector outputs.

\* \* \* \* \*